United States Patent [19]

Sturm et al.

[11] Patent Number: 4,527,330
[45] Date of Patent: Jul. 9, 1985

[54] METHOD FOR COUPLING AN ELECTRONIC DEVICE INTO AN ELECTRICAL CIRCUIT

[75] Inventors: James E. Sturm, Scottsdale; Colleen S. Peterson, Mesa, both of Ariz.

[73] Assignee: Motorola, Inc., Schaumburg, Ill.

[21] Appl. No.: 520,944

[22] Filed: Aug. 8, 1983

[51] Int. Cl.³ .............................................. H01R 43/00
[52] U.S. Cl. .................................... 29/827; 174/68.5; 228/6.2; 357/70
[58] Field of Search ..................... 29/827; 174/52 FP; 357/69, 70; 228/6 A, 180 A, 4.5

[56] References Cited

U.S. PATENT DOCUMENTS

| | | |
|---|---|---|
| 3,554,821 | 1/1971 | Caulton et al. |
| 3,614,832 | 10/1972 | Chance et al. |
| 3,700,156 | 10/1972 | Hermanns |
| 3,778,685 | 12/1973 | Kennedy |
| 3,786,375 | 1/1974 | Sato et al. |
| 4,037,772 | 7/1977 | Dupuis |
| 4,071,180 | 1/1978 | Dupuis |
| 4,246,697 | 1/1981 | Smith |

FOREIGN PATENT DOCUMENTS 45-24048  8/1970  Japan .

*Primary Examiner*—Howard N. Goldberg
*Assistant Examiner*—Carl J. Arbes
*Attorney, Agent, or Firm*—Jonathan P. Meyer

[57] ABSTRACT

A method of coupling electronic devices into electrical circuits, particularly hybrid circuits and the like, by utilizing a pre-formed lead frame. The lead frame is formed from a gold film or the like and provides smooth width variations between the signal carrying lines of the circuit and the terminal portions of the device. Wobble bonding and wire bonding processes are adapted for use in practicing the invention. High frequency and/or wide band circuits are significantly improved by use of the present invention as opposed to prior art wire bonding techniques.

8 Claims, 6 Drawing Figures

METHOD FOR COUPLING AN ELECTRONIC DEVICE INTO AN ELECTRICAL CIRCUIT

FIELD OF THE INVENTION

The present invention relates, in general, to an improved method for coupling an electronic device into an electrical circuit. More particularly, the invention relates to a method which is particularly suited to coupling discretely packaged semiconductor devices into controlled impedance, high frequency electrical circuits.

BACKGROUND OF THE INVENTION

A common problem in the manufacture of hybrid circuits is that of providing interconnections between high frequency and/or wide band, controlled impedance circuits, such as microstrip circuits, and discrete electronic devices, such as diodes and transistors. A common approach is to place the electronic device in a slot in the substrate on which the controlled impedance circuit is carried. Standard wire bond techniques are then used to connect the signal carrying conductors on the surface of the substrate adjacent to the slot to the terminals of the electronic device. However, since the electrical characteristics of the wires bridging between the signal conductors and the device terminals are substantially different from those of the controlled impedance transmission line and because of the unpredictable nature of the electrical characteristics of the junctions, this interconnection technique substantially degrades the electrical performance of the circuit. This is particularly crucial in applications requiring very high frequency, wide band and/or low signal to noise ratio performance.

SUMMARY OF THE INVENTION

Accordingly, it is an object of the present invention to provide an improved method of coupling an electronic device into an electrical circuit.

It is a further object of the present invention to provide an improved method of coupling discretely packaged electronic components into controlled impedance electrical circuits with improved electrical performance.

A particular embodiment of the present invention provides a method of forming a lead frame from a conductive film or mesh and of bonding that lead frame to the electrical circuit and to the terminals of the electronic device. The lead frame has portions which are adapted to overlie and be bonded to the signal carrying conductors of the controlled impedance circuit, portions which are adapted to overlie and be bonded to the terminals of the electronic device and portions which are adapted to provide mechanical stability to the lead frame during manufacturing operations and to be trimmed away after the electrical connections are completed. The portions overlying the signal carrying conductors are approximately the same width thereas. Furthermore, transition portions with smoothly varying widths are interposed between the portions bonded to the signal carrying conductors and the substantially narrower portions bonded to the device terminals.

The lead frame is designed to be bonded to the signal carrying conductors by means of a wobble bonding machine. This avoids the necessity for human contact with the leadframe and thus decreases the incidence of kinks or tears. Furthermore, the wobble bonding process leaves the portion of the lead frame bridging the slot in a slightly arcuate form. Thus, when a wire bonding tool is used to bond the appropriate portions of the lead frame to the device terminals, the leads assume the desired arcuate form which allows the interconnections to survive mechanical stresses.

These and other objects and advantages of the present invention will apparent to one skilled in the art from the detailed description below taken together with the drawings.

DETAILED DESCRIPTION OF THE INVENTION

Figure 1:
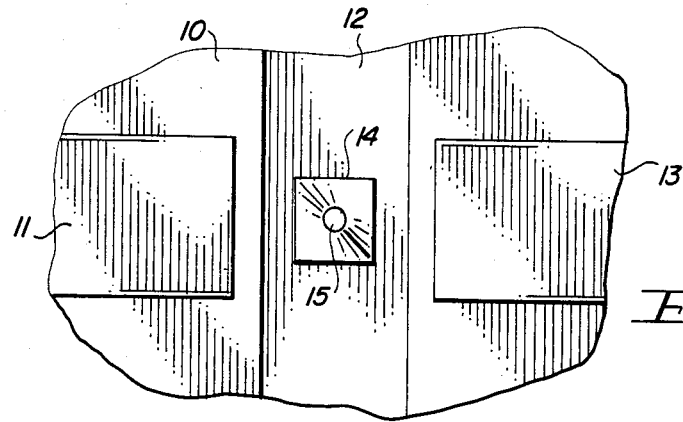
FIG. 1 is a top plan view of a portion of a microstrip circuit with a diode in position for being coupled thereto.

Refer now to FIG. 1, a typical hybrid circuit arrangement is shown in top plan view. A substrate 10, which is typically alumina or a similar material, forms the foundation of the circuit. A first signal carrying conductor 11 is disposed on the top surface of substrate 10. Conductor 11 forms a part of a controlled impedance transmission line. For instance, conductor 11 may form, with a ground plane on the opposite surface of substrate 10, a microstrip line. Typically, conductor 11 is a film of a highly conductive metal such as gold which has been deposited on substrate 10 and patterned by standard photolithographic techniques. First signal carrying conductor 11 terminates adjacent to a slot 12 in substrate 10. As will be more readily apparent from the description of FIGS. 3 and 4, below, slot 12 may extend partially or completely through substrate 10 and is used to arrange electronic devices for easy interconnection in the circuit. On the opposite side of slot 12 from first conductor 11, a second signal carrying conductor 13 is disposed on substrate 10. Second signal carrying conductor 13 forms the continuation of the controlled impedance transmission line formed by first conductor 11.

An electronic device 14 is disposed in slot 12 between the ends of conductors 11 and 13. In the case illustrated device 14 is a diode having a terminal 15 on the upper surface thereof for connection to conductors 11 and 13. For instance, diode 14 may be a shunt mounted PIN diode attenuator having its other terminal coupled to the ground plane on the opposite side of substrate 10.

In order to complete the circuit shown in FIG. 1, it is necessary to form an electrical connection between first conductor 11, terminal 15 and second conductor 13. In the prior art this has been accomplished using relatively small diameter wires. However, as such circuits are used at increasing higher frequencies and/or require higher bandwidth performance, the abrupt changes in the electrical characteristics of the circuit which are introduced by such wire bonding techniques become intolerable. The abrupt change from the controlled impedance of the transmission line formed by conductors 11 and 13 to the uncontrolled and unknown electrical characteristics of the wires forming the interconnection substantially degrades the electrical performance of the circuit. In addition, in the particular application illustrated in FIG. 1, the necessity of coupling terminal 15 to both conductor 11 and conductor 13 introduces the problem of bonding two wires to terminal 15, which may be only a few mils in diameter.

Figure 2:
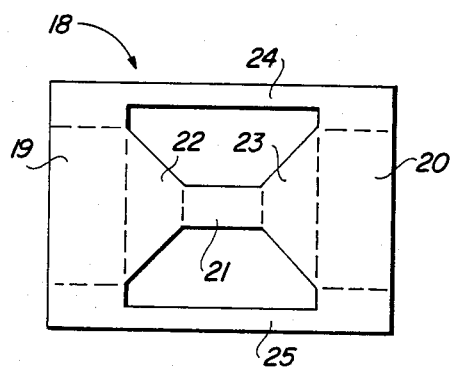
FIG. 2 is top plan view of a lead frame according to the principles of the present invention for coupling the microstrip circuit and diode of FIG. 1.

Referring now to FIG. 2, a lead frame 18 according to the principles of the present invention is shown in top plan view. Lead frame 18 is shown here broken up into various portions by dotted lines to facilitate the description thereof. Lead frame 18 is produced by standard photolithographic techniques from a film or mesh of gold or a similar, highly conductive material. It has been found that a gold film approximately 10 microns thick performs satisfactorily, although the thickness is subject to wide variation depending upon the application.

First and second lead frame portions 19 and 20, respectively, are adapted to overlie and be bonded to first and second conductors 11 and 13, respectively, of FIG. 1. The width of lead frame portions 19 and 20 is approximately equal to the width of conductors 11 and 13. A third lead frame portion 21 is adapted to overlie and be bonded to terminal 15 and is substantially narrower than portions 19 and 20. First and second transition portions 22 and 23 are interposed between third portion 21 and portions 19 and 20, respectively. Transition portions 22 and 23 have smoothly varying widths so that at no time does the width of the signal carrying portion of lead frame 18 vary abruptly. Finally, first and second frame portions 24 and 25 are adapted to provide mechanical stability to lead frame 18 during the fabrication and bonding processes and to be trimmed away once the bonding processes are complete.

Figure 3:
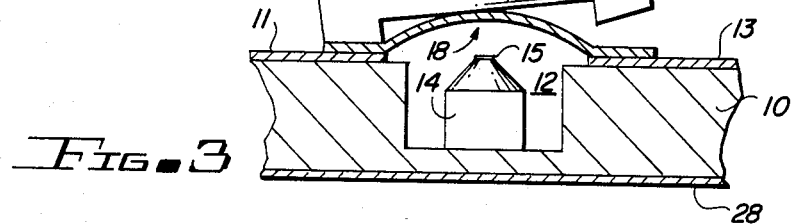
FIG. 3 is cross-sectional view of the lead frame of FIG. 2 being wobble bonded to the circuit of FIG. 1.

Referring now to FIG. 3, the first of two bonding processes used to complete the interconnection is illustrated in cross-section. Diode 14 is disposed in slot 12 of substrate 10. In some instances slot 12 may extend entirely through substrate 10 and the electrical device therein may be coupled to ground plane 28. In any case, terminal 15 of device 14 is preferably approximately in the plane of the upper surface of substrate 10. Signal carrying conductors 11 and 13 are disposed on the surface of substrate 10. Terminal 15 is shown here on a raised portion, or mesa, of diode 14, as is sometimes the case. Lead frame 18 has been picked up by a wobble bonding device 30. As is well known, the portions of wobble bonding device 30 which contact lead frame 18 are substantially similar in dimension to the periphery of lead frame 18. That is, only portions 19, 20, 24 and 25 of lead frame 18 are contacted by wobble bonding device 30. Lead frame 18 is held by wobble bonding device 30 by means of a vacuum.

After aligning lead frame 18 over conductors 11 and 13, wobble bonding device 30 applies a bonding process to the entire periphery of lead frame 18. As is familiar in the art, wobble bonding device 30 makes contact between only one point of the perphery of lead frame 18 and the circuit at any one time. The point of contact is moved around the periphery of lead frame 18 until the entire periphery has been contacted and bonded.

Two bonding processes are commonly used. The perferred method is that of thermo-compression bonding. This method uses a combination of pressure and temperature to form a bond between areas of metal which are placed into contact by wobble bonding device 30. It is also possible to use an ultrasonic bonding process in which acoustic energy propagating through wobble bonding device 30 produces the bond. However, this later process is sometimes not suitable if the material used for lead frame 18 is gold.

The nature of the wobble bonding process is such that the portion of lead frame 18 which bridges slot 12 between conductors 11 and 13 will take a slightly arcuate form as is shown in FIG. 3. If this were not the case, in other words, if lead frame 18 remained substantially planar then the finished circuit would be subject to failure upon experiencing stresses due to the differing thermal expansion coefficients of the various components of the circuit.

Figure 4:
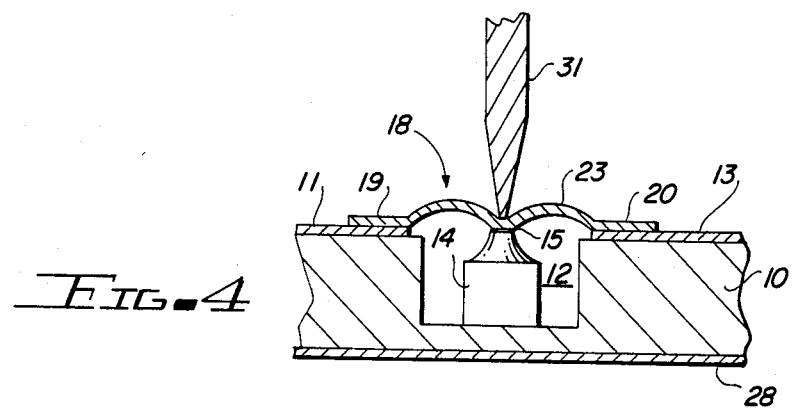
FIG. 4 is a cross-sectional view of the lead frame of FIG. 2 being bonded to the terminal portions of the diode of FIG. 1.

Referring now to FIG. 4, the second bonding process is illustrated in cross-section. A standard wire bonding device is used except that the usual stylus having a wire core is replaced with a solid core stylus 31. An operator aligns stylus 31 over the appropriate portion of lead frame 18 and over terminal 15. Stylus 31 is lowered until portion 21 of lead frame 18 is in contact with terminal 15 and a bonding process is applied. Again, the preferred process is a thermo-compression process. The result of the two processes described with reference to FIGS. 3 and 4 is that lead frame portions 19 and 20 are bonded to signal carrying conductors 11 and 13, respectively, lead frame portion 21 is bonded to terminal 15, and transition portions 22 and 23 of lead frame 18 form arcs therebetween. This arcuate form, which is shown exaggerated in FIGS. 3 and 4 is highly desirable for stress relief purposes.

Figure 5:
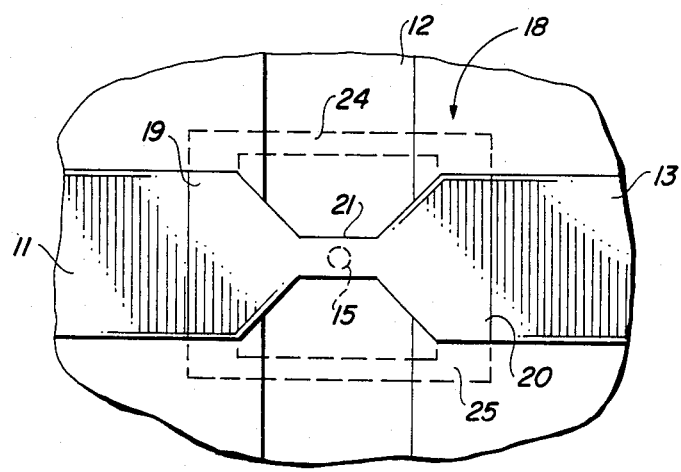
FIG. 5 is a top plan view of the completed circuit.

Referring now to FIG. 5, a completed circuit according to the principles of the present invention is shown in top plan view. Lead frame portions 19 and 20 overlie and are bonded to conductors 11 and 13 respectively on substrate 10. Lead frame portion 21 overlies and is bonded to terminal 15 of diode 14, which is disposed in slot 12. Frame portions 24 and 25 of lead frame 18 have been trimmed away and are shown by dotted lines. The trimming operation may either be performed by hand or by means of a die. Due to the geometry of lead frame 18, high frequency and/or wide bandwidth signals propagating through the circuit do not experience abrupt impedance changes when passing from conductor 11 through lead frame 18 and diode 14 to conductor 13.

Figure 6:
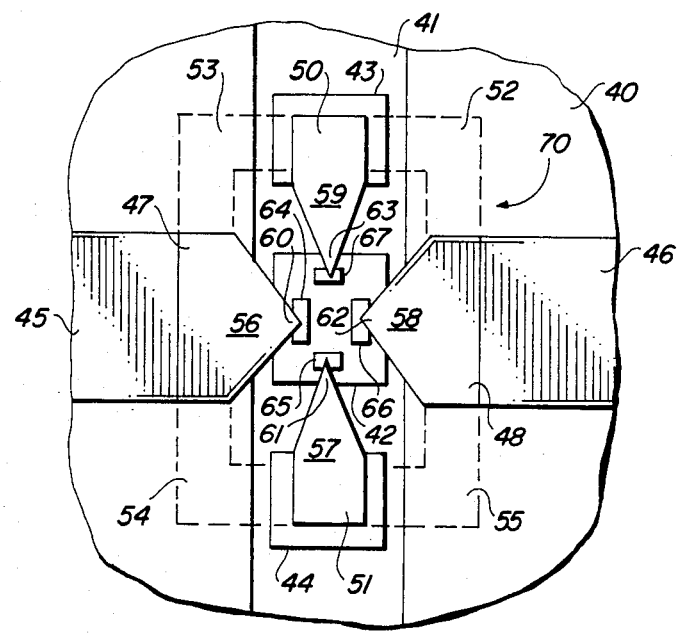
FIG. 6 is a top plan view of a completed circuit showing an alternate embodiment of the present invention.

Referring now to FIG. 6, a circuit using the principles of the present invention to couple a GaAs FET device into a hybrid circuit is shown in top plan view. A substrate 40 having a slot 41 forms the foundation for the circuit. A GaAs FET device 42 and two capacitors 43 and 44 are disposed in slot 41. A first conductor 45 and a second conductor 46 are disposed on the upper surface of substrate 40 on either side of slot 41. A lead frame 70 is comprised of portions 47 and 48, which are adapted to overlie and be bonded to conductors 45 and 70 respectively and are substantially the same width thereas; portions 50 and 51 which are adapted to overlie and be bonded to capacitors 43 and 44, respectively; frame portions 52, 53, 54 and 55 which are adapted to lend mechanical stability to lead frame 70 during the manufacturing process and to be trimmed away once lead frame 70 has been bonded to the circuit; transition portions 56, 57, 58 and 59 which are coupled to portions 47, 51, 48 and 50, respectively, and have smoothly varying widths; and terminal portions 60, 61, 62 and 63 which are adapted to overlie and be bonded to terminals 64, 65, 66 and 67, respectively, of device 42.

The processes used to bond lead frame 70 to the circuit of FIG. 6 are substantially similar to those described above. A wobble bonding device designed to contact the periphery of lead frame 46 and to hold lead frame 70 by means of a vacuum is used to align and bond the periphery of lead frame 70. This accomplishes the bonds to conductors 45 and 46 and to capacitors 43 and 44. Next, a solid tipped stylus on a wire bonding machine is use to bond portions 60, 61, 62 and 63 to terminals 64, 65, 66 and 67 respectively. Finally, frame portions 52, 53, 54 and 55 are trimmed by hand or by a specially designed die.

While the invention has been particularly shown and described with reference to a preferred embodiment thereof, it will be understood by those skilled in the art that various other modifications and changes may be made to the present invention from the principles of the invention described above without departing from the spirit and scope thereof.

We claim:

1. A method of coupling an electronic device to a signal carrying conductor on a substrate comprising the steps of:
    forming a lead frame from a conductive ribbon, said lead frame having at least one first portion adapted to overlie said signal carrying conductor and being approximately the same width thereas, said lead frame also having at least one second portion adapted to overlie a terminal of said electronic device, said lead frame also having at least one transition portion disposed between said first and second portions having a smoothly varying width, said lead frame also having at least one frame portion;
    aligning said lead frame over said signal carrying conductor and said electronic device;
    applying a bonding process to a periphery of lead frame whereby said at least one first portion is bonded to said signal carrying conductor;
    applying a bonding process to said at least one second portion, whereby said at least one second portion is bonded to said terminal, said at least one transition portion forming an arc between said signal carrying conductor and said electronic device; and
    trimming away said frame portion of said lead frame.

2. A method according to claim 1 wherein said step of applying a bonding process to a periphery of said lead frame comprises the step of applying a wobble bonding process to said lead frame.

3. A method according to claim 1 wherein said step of applying a bonding process to said at least one second portion comprises the steps of:
    bringing said at least one second portion into contact with said at least one terminal by means of a solid-tipped wire bonding stylus; and
    applying a thermo-compression bonding process by means of said solid-tipped wire bonding stylus.

4. A method of coupling an electronic device to a controlled impedance circuit of the type comprising conductive lines on a substrate comprising the steps of:
    disposing said electronic device in a slot in said substrate so that at least one terminal of said device is roughly in a plane of said conductive lines;
    aligning a leadframe over at least one of said conductive lines and said at least one terminal of said electronic device, said lead frame having at least one first portion adapted to overlie said at least one conductive line and being substantially the same width thereas, having at least one second portion adapted to overlie said at least one terminal having at least one transition portion disposed between said at least one first portion and said at least one second portion and having a substantially smooth width variation therebetween, and having a frame portion;
    applying a first bonding process to a periphery of said lead frame, whereby said at least one first portion is bonded to said at least one conductive line;
    applying a second bonding process to said at least one second portion of said lead frame whereby said at least one second portion is bonded to said at least one terminal portion; and
    trimming said frame portion of said lead frame.

5. A method according to claim 4 wherein said first bonding process is a thermo-compression wobble bonding process.

6. A method according to claim 4 wherein said second bonding process is a thermo-compression process utilizing a solid-tipped wire bonder.

7. A method according to claim 4 wherein said electronic device is a diode.

8. A method according to claim 4 wherein said electronic device is a GaAs FET.

* * * * *